United States Patent
Sparks

(10) Patent No.: US 8,021,961 B2
(45) Date of Patent: Sep. 20, 2011

(54) PROCESS OF FABRICATING MICROFLUIDIC DEVICE CHIPS AND CHIPS FORMED THEREBY

(75) Inventor: Douglas Ray Sparks, Whitmore Lake, MI (US)

(73) Assignee: Integrated Sensing Systems, Inc., Ypsilanti, MI (US)

( * ) Notice: Subject to any disclaimer, the term of this patent is extended or adjusted under 35 U.S.C. 154(b) by 138 days.

(21) Appl. No.: 12/464,426

(22) Filed: May 12, 2009

(65) Prior Publication Data

US 2009/0283844 A1  Nov. 19, 2009

Related U.S. Application Data

(60) Provisional application No. 61/127,303, filed on May 13, 2008.

(51) Int. Cl.
*H01L 21/46* (2006.01)
*F15C 1/06* (2006.01)
*F15C 1/04* (2006.01)

(52) U.S. Cl. ......... 438/456; 422/100; 137/833; 137/827

(58) Field of Classification Search ............... 73/204.26, 73/202; 422/100; 137/827, 833; 438/455–459
See application file for complete search history.

(56) References Cited

U.S. PATENT DOCUMENTS

| | | | |
|---|---|---|---|
| 6,477,901 B1 | 11/2002 | Tadigadapa et al. | |
| 6,647,778 B2 | 11/2003 | Sparks | |
| 7,351,603 B2 | 4/2008 | Sparks et al. | |
| 7,381,628 B2 | 6/2008 | Sparks et al. | |
| 2002/0001873 A1* | 1/2002 | Kang | 438/106 |
| 2002/0185557 A1* | 12/2002 | Sparks | 241/1 |
| 2004/0005628 A1 | 1/2004 | Foster | |
| 2004/0219700 A1* | 11/2004 | Silverbrook | 438/22 |
| 2004/0245102 A1* | 12/2004 | Gilbert et al. | 204/451 |
| 2006/0175303 A1 | 8/2006 | Sparks et al. | |
| 2007/0151335 A1 | 7/2007 | Sparks et al. | |

OTHER PUBLICATIONS

Danick Briand, Patrick Weber and Nicolas F. De Rooij, Metal to Glass Anodic Bonding for Microsystems Packaging, Institute of Microtechnology, Transducers 2003, vol. 2, 4C2.2, pp. 1824-1827 (2003).

D. Sparks, R. Smith, R. Schneider, J. Cripe, S. Massoud-Ansari, A. Chimbayo, N. Najafi; A variable temperature, resonant density sensor made using an improved chip-level vacuum package; Sensors and Actuators A 107, 2003, pp. 119-124.

* cited by examiner

*Primary Examiner* — Michael Lebentritt
*Assistant Examiner* — Karen Kusumakar
(74) *Attorney, Agent, or Firm* — Hartman & Hartman, P.C.; Gary M. Hartman; Domenica N. S. Hartman

(57) ABSTRACT

A process for fabricating multiple microfluidic device chips. The process includes fabricating multiple micromachined tubes in a semiconductor device wafer. The tubes are fabricated so that each tube has an internal fluidic passage and an inlet and outlet thereto defined in a surface of the device wafer. The device wafer is then bonded to a glass wafer to form a device wafer stack, and so that through-holes in the glass wafer are individually fluidically coupled with the inlets and outlets of the tubes. The glass wafer is then bonded to a metallic wafer to form a package wafer stack, so that through-holes in the metallic wafer are individually fluidically coupled with the through-holes of the glass wafer. Multiple microfluidic device chips are then singulated from the package wafer stack. Each device chip has a continuous flow path for a fluid therethrough that is preferably free of organic materials.

30 Claims, 2 Drawing Sheets

PROCESS OF FABRICATING MICROFLUIDIC DEVICE CHIPS AND CHIPS FORMED THEREBY

CROSS REFERENCE TO RELATED APPLICATIONS

This application claims the benefit of U.S. Provisional Application No. 61/127,303, filed May 13, 2008, the contents of which are incorporated herein by reference.

BACKGROUND OF THE INVENTION

The present invention generally relates to semiconductor devices and methods for their fabrication. More particularly, this invention relates to a micromachined microfluidic device and method that integrate a metallic packaging substrate to provide a fluid path through the device that is preferably free of organic materials. As nonlimiting examples, the microfluidic device can be configured as a Coriolis mass flow sensor, density sensor, specific gravity sensor, fuel cell concentration meter, chemical concentration sensor, temperature sensor, drug infusion device, fluid delivery device, gas delivery device, gas sensor, bio sensor, or medical sensor.

Processes for fabricating microelectromechanical system (MEMS) devices using silicon micromachining techniques are disclosed in commonly-assigned U.S. Pat. Nos. 6,477,901, 6,647,778, 7,351,603 and 7,381,628. As used herein, micromachining is a technique for forming very small elements by bulk etching a substrate (e.g., a silicon wafer), and/or by surface thin-film etching, the latter of which generally involves depositing a thin film (e.g., polysilicon or metal) on a sacrificial layer (e.g., oxide layer) on a substrate surface and then selectively removing portions of the sacrificial layer to free the deposited thin film. In the processes disclosed in U.S. Pat. Nos. 6,477,901, 6,647,778, 7,351,603 and 7,381,628, plasma and wet etching, photolithography, and wafer bonding techniques are used to produce micromachined microfluidic devices comprising a micromachined tube supported above a surface of a substrate. The tube is fabricated to have an inlet, outlet, and fluid passage therebetween through which a fluid flows. The tube can be vibrated at resonance, by which the mass flow rate, density, and/or other properties or parameters of the fluid can be measured as it flows through the tube.

The micromachined tubes disclosed in U.S. Pat. Nos. 6,477,901, 6,647,778, 7,351,603 and 7,381,628 can be fabricated from a semiconductor material, for example, doped or undoped silicon, and bonded to a substrate that may be formed of, for example, Pyrex, borofloat, quartz, or other glass-type inorganic amorphous solid, silicon, silicon-on-oxide (SOI), plastic, ceramic, or another material. Metal electrodes and runners used to carry electrical signals to and from the tube can be fabricated on the substrate. For purposes of conducting the fluid to and from the tube, the substrate may be further fabricated to have through-holes fluidically connected to the inlet and outlet of the fluid passage within the tube. For mass production, numerous micromachined tubes are preferably simultaneously fabricated in a semiconductor device wafer, which is then bonded to a substrate wafer, for example, by anodic, eutectic, solder, or fusion bonding. The resulting wafer stack then undergoes a dicing operation to singulate individual microfluidic device chips from the wafers.

In applications requiring protection of the micromachined tube, a capping die is preferably bonded to each microfluidic device to enclose and protect the tube. For the resonating tubes disclosed in U.S. Pat. Nos. 6,477,901, 6,647,778, 7,351, 603 and 7,381,628, the tube may be enclosed in a vacuum, which requires that the capping die is bonded (for example, anodically) to the device die to form a hermetic seal. For mass production, numerous capping dies can be simultaneously fabricated in a capping wafer, which is then bonded to the device-substrate wafer stack prior to the dicing operation such that dicing singulates individual capped microfluidic device chips from the capping-device-substrate wafer stack.

Device chips fabricated in the manner described above are typically attached to a package using an adhesive or solder. For example, a thin metal film can be deposited on the back of the device chip to provide a solderable surface, allowing the chip to be soldered to a package in a subsequent packaging step, for example, an IC packaging process using a packaging material such as a plastic or metal (for example, KOVAR®). Anodic bonding of individual device chips to a metal substrate has also been proposed, as disclosed in Briand et al., "Metal to glass anodic bonding for Microsystems packaging," Transducers 2003, Vol. 2, 4C2.2, pp. 1824-1827 (2003).

The use of a metallic instead of plastic package can be advantageous if packaging stresses are of concern, including those attributable to differing coefficients of thermal expansion (CTE), or if the fluid operated on by the microfluidic device, for example, a low or high pH liquid, a high temperature or corrosive gas or biofluid, solvent, etc., is incompatible with common plastic materials due to the risk of corrosion, contamination, or biocompatibility issues. For example, the presence of plastic and other organic materials in the package or the fluid flow path can lead to contamination, out-gassing, melting or decomposition of the organic materials.

BRIEF DESCRIPTION OF THE INVENTION

The present invention provides a process for fabricating multiple microfluidic device chips, and particularly micromachined microfluidic device chips that integrate a metallic packaging substrate and preferably provide a fluid flow path through the device chip that is free of organic materials.

According to a first aspect of the invention, the process includes fabricating a plurality of micromachined tubes in a device wafer formed of a semiconductor material. The micromachined tubes are fabricated so that each tube has an internal fluidic passage and an inlet and outlet thereto defined in a surface of the device wafer. The surface of the device wafer is then bonded to a first surface of a second wafer to form a device wafer stack, and so that a plurality of through-holes in the second wafer are individually fluidically coupled with the inlets and the outlets of the micromachined tubes and define a plurality of openings at a second surface of the second wafer. The second surface of the second wafer is then bonded to a first surface of a metallic wafer to form a package wafer stack, so that a plurality of through-holes in the metallic wafer are individually fluidically coupled with the through-holes of the second wafer and define a plurality of ports at a second surface of the metallic wafer. Multiple microfluidic device chips are then singulated from the package wafer stack. Each device chip includes a package substrate formed by a singulated portion of the metallic wafer, a singulated portion of the second wafer, a singulated portion of the device wafer, one of the micromachined tubes, a package inlet and a package outlet defined by a pair of the ports at the second surface of the metallic wafer, and a continuous flow path between the package inlet and outlet thereof and defined by, in series, one of the plurality of through-holes in the metallic wafer, one of the plurality of through-holes in the second wafer, the inlet, the passage and the outlet of the micromachined tube, one of the plurality of through-holes in the second wafer, and one of the through-holes of the metallic wafer.

A second aspect of the invention is microfluidic device chips produced by the process described above.

A significant advantage of this invention is that the use of a metallic package substrate in a microfluidic device chip allows for the elimination of any organic materials within the fluid flow path through the microfluidic device chips. By eliminating organic materials, a wider variety of fluids can be flowed through the device chips, including low or high pH liquids, high-temperature fluids, corrosive fluids, biofluids, solvents, and other fluids that tend to be incompatible with plastics and other organic materials due to potential corrosion, contamination, biocompatibility issues and the risk of out-gassing, melting or decomposition of the organic materials. Another important aspect of the invention is the wafer-level attachment of the metallic package substrate, which enables high volume production applications to lower manufacturing costs of a wide variety of microfluidic devices, nonlimiting examples of which include Coriolis mass flow sensors, density sensors, specific gravity sensors, fuel cell concentration meters, chemical concentration sensors, temperature sensors, drug infusion devices, fluid delivery devices, gas delivery devices, gas sensors, bio sensors, and medical sensors.

Other aspects and advantages of this invention will be better appreciated from the following detailed description.

DETAILED DESCRIPTION OF THE INVENTION

Figure 1:
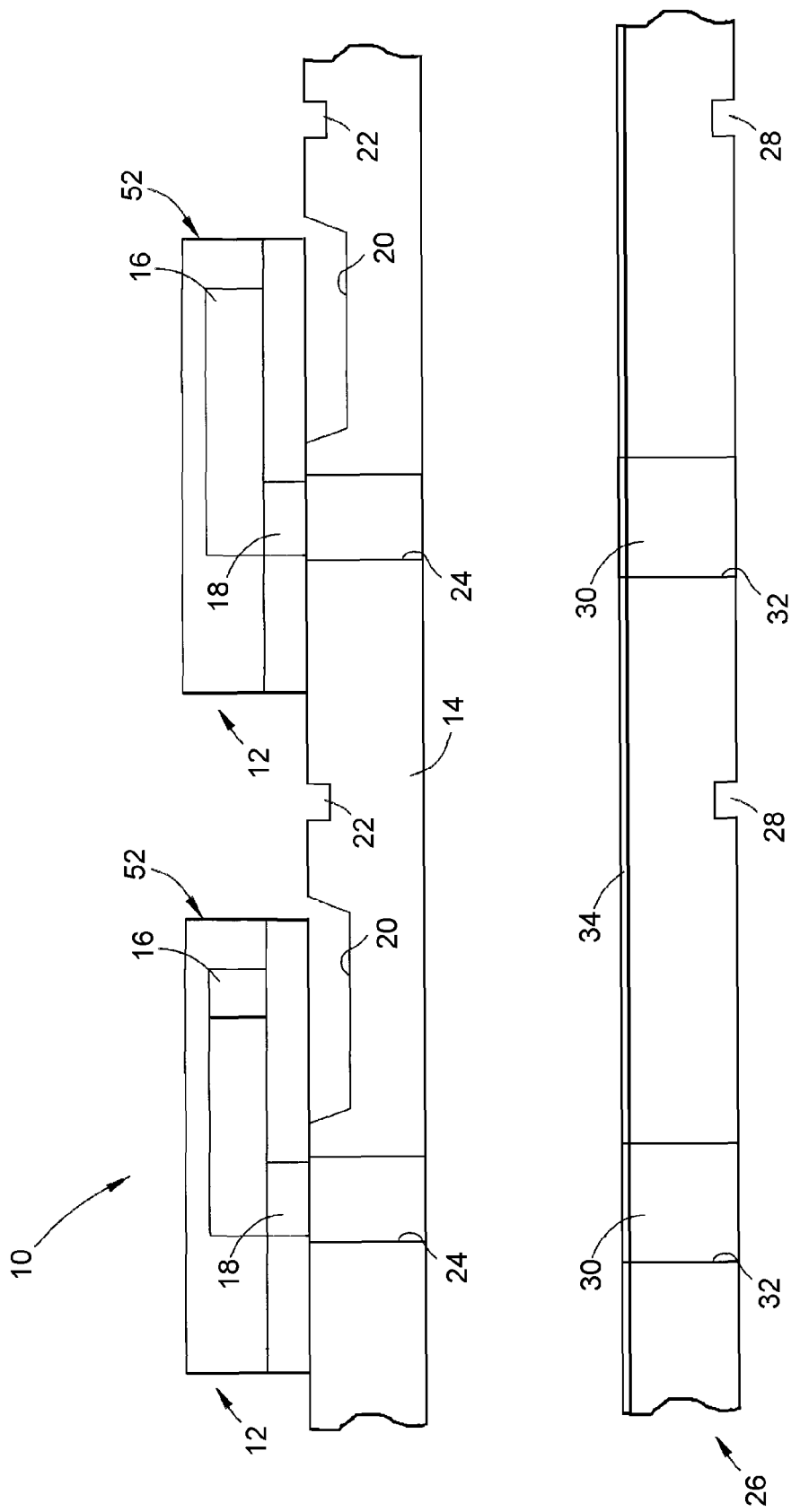
FIGS. 1 through 3 are cross-sectional views of processing steps carried out to produce multiple microfluidic device chips in accordance with a preferred embodiment of this invention.
Figure 2:
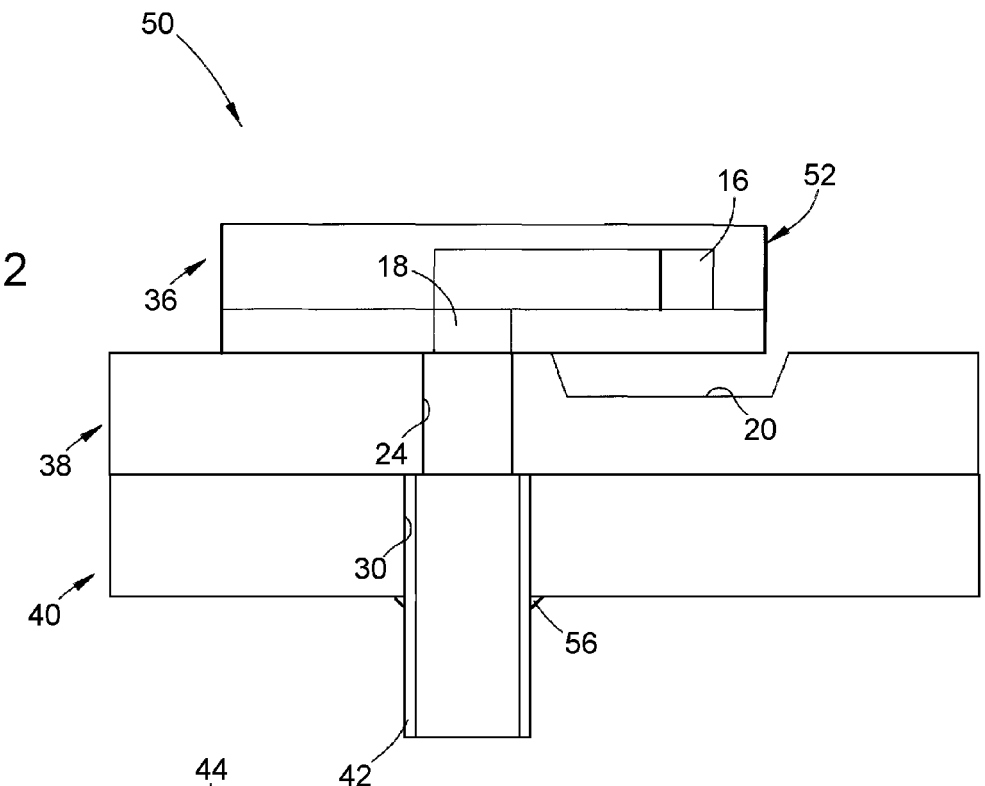
Figure 3:
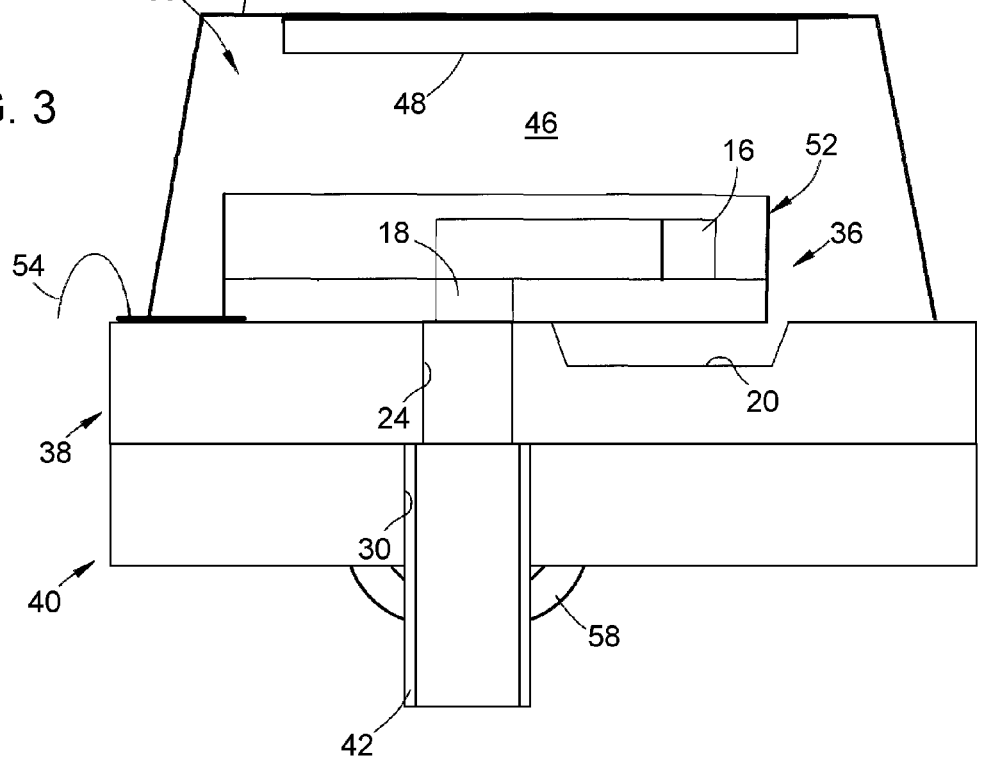

FIGS. 1 through 3 represent steps in a process carried out to produce microfluidic device chips 50 (one of which is shown in FIGS. 2 and 3) equipped with micromachined tubes (microtubes) 52. The microtubes 52 are depicted and will be described in reference to the use of the device chips 50 as Coriolis-based microfluidic devices, such as of the types disclosed in commonly-assigned U.S. Pat. Nos. 6,477,901, 6,647,778, 7,351,603 and 7,381,628. However, it should be understood that the principles of this invention are applicable to microfluidic devices adapted for use in a variety of applications, nonlimiting examples of which include mass flow sensors, density sensors, specific gravity sensors, fuel cell concentration meters, chemical concentration sensors, temperature sensors, drug infusion devices, fluid delivery devices, gas delivery devices, gas sensors, bio sensors, and medical sensors, as well as references, actuators and other types of microfluidic devices through which a liquid or gas flows. The drawings are drawn for purposes of clarity when viewed in combination with the following description, and therefore are not necessarily to scale.

FIG. 1 depicts a limited portion of a device wafer stack 10 formed by a pair of wafers 12 and 14. The wafer 12 will be termed a device wafer 12 for the reason that the microtubes 52 are fabricated in the wafer 12. The device wafer 12 is preferably formed of a semiconductor material, most preferably silicon, though other semiconducting materials could be used. The wafer 12 may be single-crystal or polycrystalline and may be undoped, though in a preferred embodiment the wafer 12 is doped so that the microtubes 52 are conductive and therefore can be electrically actuated, as disclosed in commonly-assigned U.S. Pat. Nos. 6,477,901, 6,647,778, 7,351,603 and 7,381,628. Suitable methods for fabricating the device wafer 12 and its microtubes 52 include processes disclosed in U.S. Pat. Nos. 6,477,901, 6,647,778, 7,351,603 and 7,381,628. As such, the contents of these patents relating to the fabrication and operation of microfluidic devices are incorporated herein by reference. The second wafer 14 will be termed a glass wafer 14, in that preferred materials for the wafer 14 are Pyrex, borofloat, quartz, or other glass-type inorganic amorphous solid materials. The wafers 12 and 14 are preferably sufficiently thick to permit handling, while the lateral dimensions of the wafers 12 and 14 are generally large enough such that, after the bonding processes discussed below, the resulting package wafer stack can be subsequently diced into a number of individual device chips, of which the chip 50 in FIGS. 2 and 3 is an example.

The microtubes 52 can be fabricated to have a variety of configurations that enable the microtubes 52 to be operable for sensing properties of a fluid, for example, using Coriolis principals. For example, when viewed from above (normal to the upper or frontside surface of the device wafer 12) each microtube 52 may be U-shaped to comprise a pair of parallel legs (one of which is shown in longitudinal cross-section) and an interconnecting distal portion. Other notable shapes for the microtubes 52 include C-shaped tubes of U.S. patent application Ser. Nos. 11/620,908, 12/267,263 and 12/369,118, double tubes of U.S. patent application Ser. Nos. 12/143,942 and 12/267,263, S-shaped tubes of U.S. patent application Ser. Nos. 11/620,411 and 12/267,263, and straight tubes of U.S. patent application Ser. No. 12/369,510. The contents of these applications relating to the configurations and uses of their microtubes are incorporated herein by reference. FIG. 1 shows each microtube 52 as having an internal passage 16 fluidically connected to inlet and outlet holes 18 (only one of which is shown). Each internal passage 16 and its outer walls can be fabricated in the device wafer 12 by plasma etching, wet etching, grinding, bead blasting, ultrasonic machining, deep reactive ion etching (DRIE), laser machining and other methods known to those skilled in the art. The inlet and outlet holes 18 can be formed in the device wafer 12 by etching, preferably DRIE.

The shape and size of the microtubes 52 are preferably chosen to provide a suitable flow capacity and, if appropriate, have suitable vibration parameters for the fluid to be evaluated with the device chips 50. Because micromachining technologies are employed to fabricate the microtubes 52, their size can be extremely small, such as lengths of about 0.5 mm and cross-sectional areas of about 250 square micrometers, with smaller and larger tubes also being within the scope of this invention. Because of the ability to produce the microtubes 52 at such miniaturized sizes, the device chips 50 can be used to process very small quantities of fluid for analysis.

Bonding of the wafers 12 and 14 can be accomplished by a variety of techniques, such as anodic, fusion, solder, glass frit, and eutectic bonding, each of which is well known in the art and does not require any detailed discussion here. As a result of bonding the wafers 12 and 14, the microtubes 52 are cantilevered over recesses 20 formed in the surface of the glass wafer 14, thereby allowing for movement of the microtubes 52 relative to the wafer 14. FIG. 1 also shows the glass wafer 14 as having grooves 22 etched in its surface along which the device chips 50 can be singulated with a saw, laser, electric discharge, water jet, bead blasting, or any other suitable process. Finally, the glass wafer 14 has a number of through-holes 24 corresponding in number, location and approximate cross-sectional area to the inlets and outlets 18 of the microtubes 52. The through-holes 24 define openings at the lower or backside surface of the glass wafer 12, which defines the lower or backside surface of the device wafer stack 10.

FIG. 1 shows the device wafer stack 10 prepared and aligned for bonding to a third wafer 26, which on completion will form what will be referred to herein as a package substrate (40 in FIGS. 2 and 3) of a package wafer stack comprising the device, glass and third wafers 12, 14 and 26. According to a preferred aspect of the invention, the third wafer 26 is formed of a metallic material, most preferably a corrosion-resistant metal alloy having a coefficient of thermal expansion (CTE) that approximates the CTE of the glass wafer 14. For this reason, iron-nickel based alloys are preferred, including but not limited to iron-nickel alloys commercially available under the names Alloy 42 and INVAR®, and iron-nickel-cobalt alloys commercially available under the name KOVAR®, though it is foreseeable that other alloys could be used, for example, a nickel-based superalloy such as Hastelloy, or a titanium, tungsten, molybdenum, or stainless steel alloy. Similar to the glass wafer 14, the metallic wafer 26 is shown in FIG. 1 as having grooves 28 etched or otherwise formed in its surface along which the device chips 50 will be singulated from the package wafer stack. The grooves 28 also potentially serve to reduce thermomechanical stress that occurs during bonding of the metallic wafer 26 to the glass wafer 14. It may also be desirable to tailor the thicknesses of the glass wafer 14 and/or metallic wafer 26 to further reduce thermomechanical stresses between the wafers 14 and 26.

The metallic wafer 26 is also shown as having a number of through-holes 30 corresponding in number and location to the through-holes 24 of the glass wafer 14, such that after bonding the aligned through-holes 24 and 30 define a continuous flow path with the internal passages 16 of the microtubes 52. The through-holes 30 also define ports 32 at the lower surface of the metallic wafer 12, which defines the lower or backside surface of the package wafer stack. The upper surface of the metallic wafer 26 is shown in FIG. 1 as provided with an optional bonding layer 34 containing one or more bonding materials for bonding the metallic wafer 26 to the glass wafer 14. The bonding layer 34 may be in the form of a thin-film stack formed of one or more solder or eutectic alloys for bonding of the wafers 14 and 26 by solder attachment or eutectic bonding. Other methods for bonding the wafers 14 and 26 that do not require a bonding layer 34 are foreseeable and also within the scope of the invention. To promote bonding of the metallic wafer 26 to the glass wafer 14, the upper surface of the metallic wafer 26 to be mated with the glass wafer 14 preferably undergoes polishing to provide a good bonding surface.

As evident from FIG. 1, the continuous flow path defined by the through-holes 24 and 30 of the wafers 13 and 26 and the inlets/outlets 18 and internal passages 16 of the microtubes 52 are free of any organic materials. Most notably, the metallic wafer 26 serves as the package substrate 40 for each device chip 50 (as shown in FIGS. 2 and 3), thus eliminating the use of plastic packaging that would come in contact with the fluid flowing through the device chips 50. In addition, the flow path is preferably free of epoxies, silicones and other adhesives often used to attach MEMS chips to a package surface. Subsequent assembly of one of the chips 50 with a fluid system is also preferably performed without the use of elastomeric o-rings, gaskets and grommets to seal the metallic package substrate 40 of the chip 50 to the remainder of the fluid system. As a result, preferred device chips 50 of this invention can be employed to handle fluids that would otherwise raise corrosion, contamination or biocompatibility issues, such as low and high pH liquids, high-temperature fluids, corrosive fluids, biofluids, etc., which can cause organic materials to out-gas, melt, decompose or otherwise contaminate the fluid. Because the metallic wafer 26 is bonded to the device wafer stack 10 at the wafer level, the process described above is ideal for high-volume production applications to lower manufacturing costs.

FIG. 2 represents the appearance of a single device chip 50 following bonding of the metallic wafer 26 to the device wafer stack 10 to form the package wafer stack, and then singulation to separate the multiple chips 50 from the package wafer stack by cutting through the glass and metallic wafers 14 and 26. As previously noted, singulation can be achieved by sawing (or another suitable technique) along the grooves 22 and 28 provided in the surfaces of the glass and metallic wafers 14 and 26. From the forgoing, it should be apparent that the singulation step is preferably performed after MEMS processing of the device chips 50 has been completed. For clarity, the portions of the device chip 50 defined by singulated portions of the device, glass and metallic wafers 12, 14 and 26 are identified in FIG. 2 as the device layer 36, glass layer 38, and package substrate 40 of the device chip 50.

FIG. 2 further shows one of two tubes 42 that are preferably attached to the device chip 50 after singulation. The tubes 42 are received in the ports 32 of the package substrate 40 defined by the through-holes 30 of the metallic wafer 26. As with the metallic wafer 26, the tubes 42 are also preferably formed of a metallic material and secured to the package substrate 40 without the use of any organic materials. For example, the tubes 42 can be formed of a stainless steel alloy or any other metallic material that is compatible with the fluid that will flow through the device chip 50. The tubes 42 can be of any desired length and configured as package inlet and outlet conduits for direct connection to a fluidic system via welding, fittings, couplers, or any other suitable method.

The through-holes 30 of the package substrate 40 (formed by a singulated portion of the metallic wafer 26) are shown in FIG. 2 as being oversized relative to the through-holes 24 in the glass layer 38 (formed by a singulated portion of the glass wafer 14), such that the tubes 42 extend completely through the package substrate 40 and the ends of the tubes 42 abut the glass layer 38 of the chip 50. Alternatively, the through-holes 24 in the glass layer 38 could also be oversized, so that the ends of the tubes 42 abut the device layer 36 of the chip 50. The tubes 42 may be attached to the metallic package substrate 40 by welding, brazing, soldering, or bonding by some other method that does not introduce an organic material into the flow path through the device chip 50. A localized weldment 56 formed by laser welding is believed to be preferred for securing the tubes 42 due to the capability of laser welding causing only localized heating. Alternatively or in addition, the tubes 42 and their mating ports 32 can be configured to provide a retention feature, for example, complementary threads to provide a threaded coupling between the tubes 42 and their mating ports 32. A reinforcement 58 is shown in FIG. 3 as encapsulating the tube-to-wafer joint to prevent leakage and reduce mechanical wear, fatigue and breakage. The reinforcement 58 can be formed by, for example, soldering, welding, or brazing, or with an adhesive, collar, potting material, jig, etc.

Finally, FIG. 3 shows the microtube 52 as being enclosed by a capping die 44. The capping die 44 can be provided by bonding a capping wafer (not shown) to the device wafer stack 10 prior to singulation, or individually bonding the capping die 44 to the singulated device chip 50. The capping die 44 serves to provide a protective enclosure 46 surrounding the microtube 52. In applications where device performance can be enhanced by maintaining a vacuum within the enclosure 46, the die 44 can be vacuum sealed to the frontside surface of the glass layer 38. For example, the dynamic performance of a vibrating microtube 52 in accordance with U.S. Pat. Nos. 6,477,901, 6,647,778, 7,351,603 and 7,381,628 can be significantly enhanced by maintaining a vacuum within the enclosure 46. A variety of materials can be considered for the capping die 44, including but not limited to silicon, glass, ceramic, and plastic wafers that can be processed to have a sufficiently deep cavity to accommodate the microtube 52. The capping die 44 is shown as having an integrated getter 48 to improve vacuum quality in accordance with known practices. Depending on the materials of the glass wafer 14 and capping die 44, attachment and sealing of the capping die 44 to the glass layer 38 can be by glass frit, eutectic, solder, anodic, or another bonding technique known in the art. Alternatively, this step can be omitted if an acceptable vacuum can be formed without wafer-to-wafer bonding. In addition, the capping die 44 can be omitted and enclosure of the microtube 52 can be performed in a subsequent packaging step, such as but not limited to IC packaging (e.g., an IC package with a KOVAR® lid) or product packaging.

The microtube 52 can be electrically interconnected by conductive runners, wirebonds, or any other suitable means to drive and sensor electrodes (not shown) located within the recess 20 or elsewhere to enable driving and sensing of the microtube 52. The drive electrodes can drive the microtube 52 electrostatically or by any other suitable technique, including but not limited to piezoelectric, piezoresistive, acoustic, ultrasonic, magnetic, and optic actuation techniques. Movement of the microtube 52 can also be sensed using a variety of techniques, such as capacitively, piezoelectrically, piezoresistively, acoustically, ultrasonically, magnetically, optically, etc. FIG. 3 shows one of any number of wirebonds 54 provided for electrically connecting the device chip 50 to external circuitry (not shown), such as printed circuit boards, ASICs, amplifiers, and/or signal conditioning circuitry. ASICs may be mounted on a circuit board or on the glass layer 38, cap die 44, or elsewhere. If so desired, the metallic package substrate 40 can be grounded to provide an electromagnetic shield for the device chip 50.

While the invention has been described in terms of a particular embodiment, it is apparent that other forms could be adopted by one skilled in the art. Therefore, the scope of the invention is to be limited only by the following claims.

The invention claimed is:

1. A process of fabricating multiple microfluidic device chips, the process comprising:
    fabricating a plurality of micromachined tubes in a device wafer formed of a semiconductor material, the micromachined tubes being fabricated so that each micromachined tube has an internal fluidic passage and an inlet and outlet thereto defined in a surface of the device wafer;
    bonding the surface of the device wafer to a first surface of a second wafer to form a device wafer stack and so that a plurality of through-holes in the second wafer are individually fluidically coupled with the inlets and the outlets of the micromachined tubes and define a plurality of openings at a second surface of the second wafer;
    bonding the second surface of the second wafer to a first surface of a metallic wafer to form a package wafer stack so that a plurality of through-holes in the metallic wafer are individually fluidically coupled with the through-holes of the second wafer and define a plurality of ports at a second surface of the metallic wafer, wherein the step of bonding the second wafer to the metallic wafer comprises depositing a bonding material on the first surface of the metallic wafer prior to bonding the second wafer to the metallic wafer, and the second and metallic wafers are bonded to each other with the bonding material;
    singulating multiple microfluidic device chips from the package wafer stack, each of the multiple microfluidic device chips comprising a package substrate formed by a singulated portion of the metallic wafer, a singulated portion of the second wafer, a singulated portion of the device wafer, one of the micromachined tubes, a package inlet and a package outlet port defined by a pair of the ports at the second surface of the metallic wafer, and a continuous flow path between the package inlet and outlet thereof and defined by, in series, one of the plurality of through-holes in the metallic wafer, one of the plurality of through-holes in the second wafer, the inlet, the passage and the outlet of the micromachined tube, a second of the plurality of through-holes in the second wafer, and a second of the through-holes of the metallic wafer.

2. The process according to claim 1, further comprising the step of bonding a cap wafer to the device wafer, the cap wafer defining cavities that enclose the micromachined tube of each device wafer stack, whereby each of the microfluidic device chips formed by the singulating step comprises a cap die enclosing the micromachined tube thereof.

3. The process according to claim 2, wherein the bonding of the cap wafer results in a vacuum within each of the cavities and hermetic seals between the cap wafer and the device wafer.

4. The process according to claim 1, further comprising defining a plurality of grooves in at least the second surface of the metallic wafer, the singulating step comprising severing the metallic wafer along the grooves to singulate the microfluidic device chips.

5. The process according to claim 4, wherein only the second and metallic wafers are severed during the singulating step.

6. The process according to claim 1, wherein the second wafer is formed of a glass-type inorganic amorphous solid.

7. The process according to claim 1, wherein the metallic wafer is formed of an iron-nickel alloy, an iron-nickel-cobalt alloy, a nickel-based superalloy, a titanium alloy, a tungsten alloy, a molybdenum alloy, or a stainless steel alloy.

8. The process according to claim 1, further comprising inserting ends of package inlet and outlet tubes into each of the package inlets and package outlets of the microfluidic device chips, and bonding the ends of the inlet and outlet tubes to the package substrates formed by the singulated portions of the metallic wafer to define inlet and outlet conduits to the microfluidic device chips.

9. The process according to claim 8, wherein the ends of the inlet and outlet tubes and the package inlets and outlets of the microfluidic device chips have complementary threads and define a threaded connection between each of the inlet and outlet tubes and the microfluidic device chips.

10. The process according to claim 8, further comprising bonding the ends of the inlet and outlet tubes to the package substrates with an attachment material chosen from the group consisting of weld, braze, and solder materials.

11. The process according to claim 10, further comprising performing an additional step to reinforce the attachment material.

12. The process according to claim 11, wherein the additional step comprises encapsulating the attachment material with a second material chosen from the group consisting of solder, weld, brazing, and adhesive materials.

13. The process according to claim 1, wherein the bonding material comprises a thin-film stack formed of one or more solder or eutectic alloys for bonding of the second and metallic wafers by solder attachment or eutectic bonding.

14. The process according to claim 1, wherein all surfaces of the continuous flow path of each microfluidic device chip that are contacted by a fluid flowing therethrough are free of organic materials.

15. The process according to claim 1, further comprising electrically grounding the package substrate of at least one of the microfluidic device chips.

16. The process according to claim 1, wherein the micromachined tubes are adapted for vibrational movement relative to the second wafer.

17. A microfluidic device chip formed by the process of claim 1.

18. The microfluidic device chip according to claim 17, wherein the microfluidic device chip is chosen from the group consisting of Coriolis mass flow sensors, density sensors, specific gravity sensors, fuel cell concentration meters, chemical concentration sensors, temperature sensors, drug infusion devices, fluid delivery devices, gas delivery devices, gas sensors, bio sensors, and medical sensors.

19. A process of fabricating multiple microfluidic device chips, the process comprising:
fabricating a plurality of micromachined tubes in a device wafer formed of a semiconductor material, the micromachined tubes being fabricated so that each micromachined tube has an internal fluidic passage and an inlet and outlet thereto defined in a surface of the device wafer;
bonding the surface of the device wafer to a first surface of a glass wafer to form a device wafer stack and so that a plurality of through-holes in the glass wafer are individually fluidically coupled with the inlets and the outlets of the micromachined tubes and define a plurality of openings at a second surface of the glass wafer;
bonding a cap wafer to the device wafer stack, the cap wafer defining cavities that enclose the micromachined tubes of the device wafer stack;
bonding the second surface of the glass wafer to a first surface of a metallic wafer to form a package wafer stack so that a plurality of through-holes in the metallic wafer are individually fluidically coupled with the through-holes of the glass wafer and define a plurality of ports at a second surface of the metallic wafer, wherein the step of bonding the glass wafer to the metallic wafer comprises depositing a bonding material on the first surface of the metallic wafer prior to bonding the glass wafer to the metallic wafer, and the glass and metallic wafers are bonded together with the bonding material;
singulating multiple microfluidic device chips from the package wafer stack, each of the multiple microfluidic device chips comprising a package substrate formed by a singulated portion of the metallic wafer, a singulated portion of the glass wafer, a singulated portion of the device wafer, a singulated portion of the cap wafer, one of the micromachined tubes enclosed by the singulated portion of the cap wafer, a package inlet and a package outlet port defined by a pair of the ports at the second surface of the metallic wafer, and a continuous flow path between the package inlet and outlet thereof and defined by, in series, one of the plurality of through-holes in the metallic wafer, one of the plurality of through-holes in the glass wafer, the inlet, the passage and the outlet of the micromachined tube, a second of the plurality of through-holes in the glass wafer, and a second of the through-holes of the metallic wafer;
inserting ends of inlet and outlet tubes into each of the package inlets and package outlets of the microfluidic device chips; and
bonding the ends of the inlet and outlet tubes to the package substrates defined by the singulated portions of the metallic wafer to define inlet and outlet conduits to the microfluidic device chips;
wherein all surfaces of the continuous flow path of each microfluidic device chip that are contacted by a fluid flowing therethrough are free of organic materials.

20. The process according to claim 19, wherein the bonding of the cap wafer to the device wafer stack results in a vacuum within each of the cavities and hermetic seals between the cap wafer and the device wafer.

21. The process according to claim 19, further comprising defining a plurality of grooves in at least the second surface of the metallic wafer, the singulating step comprising severing the metallic wafer along the grooves to singulate the microfluidic device chips.

22. The process according to claim 19, wherein only the glass and metallic wafers are severed during the singulating step.

23. The process according to claim 19, wherein the metallic wafer is formed of an iron-nickel alloy, an iron-nickel-cobalt alloy, a nickel-based superalloy, a titanium alloy, a tungsten alloy, a molybdenum alloy, or a stainless steel alloy.

24. The process according to claim 19, wherein the ends of the inlet and outlet tubes and the package inlets and outlets of the microfluidic device chips have complementary threads and define a threaded connection between each of the inlet and outlet tubes and the microfluidic device chips.

25. The process according to claim 19, wherein the ends of the inlet and outlet tubes are bonded to the package substrates by a method chosen from the group consisting of welding, brazing, and soldering.

26. The process according to claim 19, wherein the bonding material comprises a thin-film stack formed of one or more solder or eutectic alloys for bonding of the glass and metallic wafers by solder attachment or eutectic bonding.

27. The process according to claim 19, further comprising electrically grounding the package substrate of at least one of the microfluidic device chips.

28. The process according to claim 19, wherein the micromachined tubes are adapted for vibrational movement relative to the glass wafer.

29. A microfluidic device chip formed by the process of claim 19.

30. The microfluidic device chip according to claim 29, wherein the microfluidic device chip is chosen from the group consisting of Coriolis mass flow sensors, density sensors, specific gravity sensors, fuel cell concentration meters, chemical concentration sensors, temperature sensors, drug infusion devices, fluid delivery devices, gas delivery devices, gas sensors, bio sensors, and medical sensors.

* * * * *